US007572100B2

(12) United States Patent  (10) Patent No.: US 7,572,100 B2
Strohm  (45) Date of Patent: Aug. 11, 2009

(54) EQUIPMENT FAN

(75) Inventor: Rainer Strohm, St. Georgen (DE)

(73) Assignee: EBM-PAPST St. Georgen GmbH & Co. KG, St. Georgen (DE)

( * ) Notice: Subject to any disclaimer, the term of this patent is extended or adjusted under 35 U.S.C. 154(b) by 461 days.

(21) Appl. No.: 11/422,588

(22) Filed: Jun. 6, 2006

(65) Prior Publication Data

US 2006/0279927 A1  Dec. 14, 2006

(30) Foreign Application Priority Data

Jun. 10, 2005  (DE) .................. 20 2005 009 522 U

(51) Int. Cl.
*F04D 29/64* (2006.01)
(52) U.S. Cl. .................... 415/213.1; 361/695
(58) Field of Classification Search ............. 415/213.1, 415/214.1, 220, 232; 416/69, 70 R
See application file for complete search history.

(56) References Cited

U.S. PATENT DOCUMENTS

| 5,673,029 | A | 9/1997 | Behl et al. .................. 340/635 |
| 6,189,848 | B1 | 2/2001 | Barnett et al. ........... 248/231.81 |
| 6,556,437 | B1 | 4/2003 | Hardin ........................ 361/687 |
| 6,592,327 | B2 * | 7/2003 | Chen et al. ................ 415/213.1 |
| 6,633,486 | B2 | 10/2003 | Coles et al. ................. 361/726 |
| 6,714,411 | B2 | 3/2004 | Thompson .................. 361/695 |
| 6,817,940 | B2 | 11/2004 | Pfannenberg ............... 454/184 |
| 6,942,471 | B2 | 9/2005 | Weisser ................... 417/423.1 |
| 6,985,358 | B2 | 1/2006 | Thompson .................. 361/695 |
| 7,147,435 | B2 * | 12/2006 | Lien et al. ................. 415/213.1 |
| 7,167,371 | B2 | 1/2007 | Coles et al. .................. 361/726 |
| 2003/0035724 | A1 | 2/2003 | Chen ........................ 415/213.1 |
| 2003/0099094 | A1 | 5/2003 | Coles et al. ................. 361/726 |
| 2003/0123222 | A1 | 7/2003 | Thompson .................. 361/687 |

(Continued)

FOREIGN PATENT DOCUMENTS

DE  197 01 548 A1  8/1997

(Continued)

OTHER PUBLICATIONS

EBM-PAPST, Diagonal Venturi Fans Provide Compact Cooling, Electronics Talk, Apr. 22, 2003, 2.

(Continued)

*Primary Examiner*—Richard Edgar
(74) *Attorney, Agent, or Firm*—Milton Oliver, Esq.; Oliver Intellectual Property LLC

(57) ABSTRACT

An equipment fan has a housing (100) which is configured as a plug-in module for an equipment rack. The housing has a front side (102) and a back side (104), the latter being slid into the equipment rack (320) first upon installation. For latching into this kind of equipment, the housing (100) has at least one resiliently deflectable detent member (142, 152), which, for its actuation, is associated with a respective actuation member (144, 154) that is operable from the front side of the housing. Troughs (160, 170) are located on the front side (102), and a respective actuator (146, 148, 156, 158) for each deflectable member is located in each. The detent member (142, 152) has pretensioning which urges the detent member away from the housing (100) so that, when the housing is slid into a piece of equipment, latching of the housing (100) therein is accomplished.

17 Claims, 12 Drawing Sheets

U.S. PATENT DOCUMENTS

| | | |
|---|---|---|
| 2004/0145881 A1 | 7/2004 | Kosugi ........................ 361/810 |
| 2004/0207983 A1 | 10/2004 | Lu ............................... 361/695 |
| 2005/0088818 A1 | 4/2005 | Chou .......................... 361/695 |
| 2005/0139348 A1* | 6/2005 | Lu et al. ................. 165/104.33 |
| 2005/0174734 A1 | 8/2005 | Chen .......................... 361/695 |

FOREIGN PATENT DOCUMENTS

| | | |
|---|---|---|
| DE | 202 08 609 U1 | 8/2002 |
| DE | 102 38 283 A1 | 3/2004 |
| DE | 102 53 227 A1 | 5/2004 |
| DE | 10-2005-000628 A1 | 9/2005 |
| EP | 1 392 095 B1 | 8/2003 |
| TW | 231 418 | 4/2005 |

OTHER PUBLICATIONS

EBM-PAPST, Fans For Electronics Cooling, Electronics Talk, Jul. 21, 2003, 1 p.

Ian McLeod of EBM-PAPST, Cooling Fans Go Diagonal, Electronics Talk Aug. 6, 2003, 4 pp.

* cited by examiner

EQUIPMENT FAN

CROSS-REFERENCE

This application claims priority from my German application DE 20 2005 009 522.2 of 10 Jun. 2005, the entire content of which is hereby incorporated by reference.

FIELD OF THE INVENTION

The invention relates to an equipment fan, having a housing which is configured for installing the equipment fan in a piece of equipment.

BACKGROUND

Electronic components in equipment such as computers usually require cooling. To provide such cooling, equipment fans are used, which are located in a housing.

Because electronic components are used in many different kinds of equipment, equipment fans are necessary and must be installed even at poorly accessible points, such as in vehicles of all kinds where space is often very scarce. In such concealed places, removing a fan, for instance for repair or for replacement with a new fan, is often very difficult.

In certain applications, it must be possible to swap out an equipment fan very quickly, so that a fan failure cannot cause any overheating damage to the electronics. This is also known as "changing on the fly." There is accordingly a need for an equipment fan which can be mounted and dismounted quickly and simply in a control box, fan plug-in module, or the like.

Electronic components are often located in a control box, also called a "rack." It is usually required that such a control box be shielded, so that only very little electromagnetic radiation can escape from it; that is, the control box must be "EMC-protected," i.e. protected to assure Electro-Magnetic Compatibility with other nearby electrical devices. Any openings, especially on the front side of such a control box, should, for this reason, not exceed a certain dimension, related to the wavelength of the electromagnetic noise involved. If fans are used that are easily swapped out, this requirement also applies to those fans, and this requirement must be combined with the need for easy installation and easy exchangeability.

SUMMARY OF THE INVENTION

It is therefore an object of the present invention to provide a novel equipment fan which can be readily swapped out.

According to the invention, this object is accomplished by an equipment fan with a drawer-shaped housing having laterally movable detent elements operable from the housing faceplate. An equipment fan of this kind has a housing which is adapted for use as a plug-in module. The housing has a front side, and a back side essentially diametrically opposite the front side; when mounting it in a rack or other piece of equipment, the back side is introduced into the equipment first, and for latching it in the equipment, the housing has at least one resiliently deflectable detent member, to which a respective actuation member that is operable from the front side of the housing is associated. As a result, as the housing is plugged in, its latching is achieved, without requiring special assembly steps. This latching can be undone again by actuating the actuation member(s).

A preferred refinement of the equipment fan of the invention is to arrange two actuation members on the front side of the housing, spaced so that they can be pressed by the thumb and a finger of the same hand. According to it, the housing and the actuation member are configured to enable one-handed mounting in and/or dismounting of the housing in the equipment. The housing can thus quickly be pushed into an associated piece of equipment, such as a plug-in fan module, and removed from it again.

Another preferred refinement of the equipment fan of the invention is for the housing front side to perform electromagnetic shielding functions. According to it, the housing is provided with a faceplate having at least one trough or depression, into which the actuation members, for instance, protrude, and the faceplate is formed of material which reduces the emission of electromagnetic radiation from the housing or from the control box. The housing thus also has the function of a radiation protection cage, or shielding to protect surrounding electronic components against radiation emerging from the equipment fan or the control box.

BRIEF FIGURE DESCRIPTION

Further details and advantageous refinements of the invention will become apparent from the exemplary embodiments, described below and shown in the drawings, which are not to be understood in any way as a limitation upon the invention.

Figure 2:
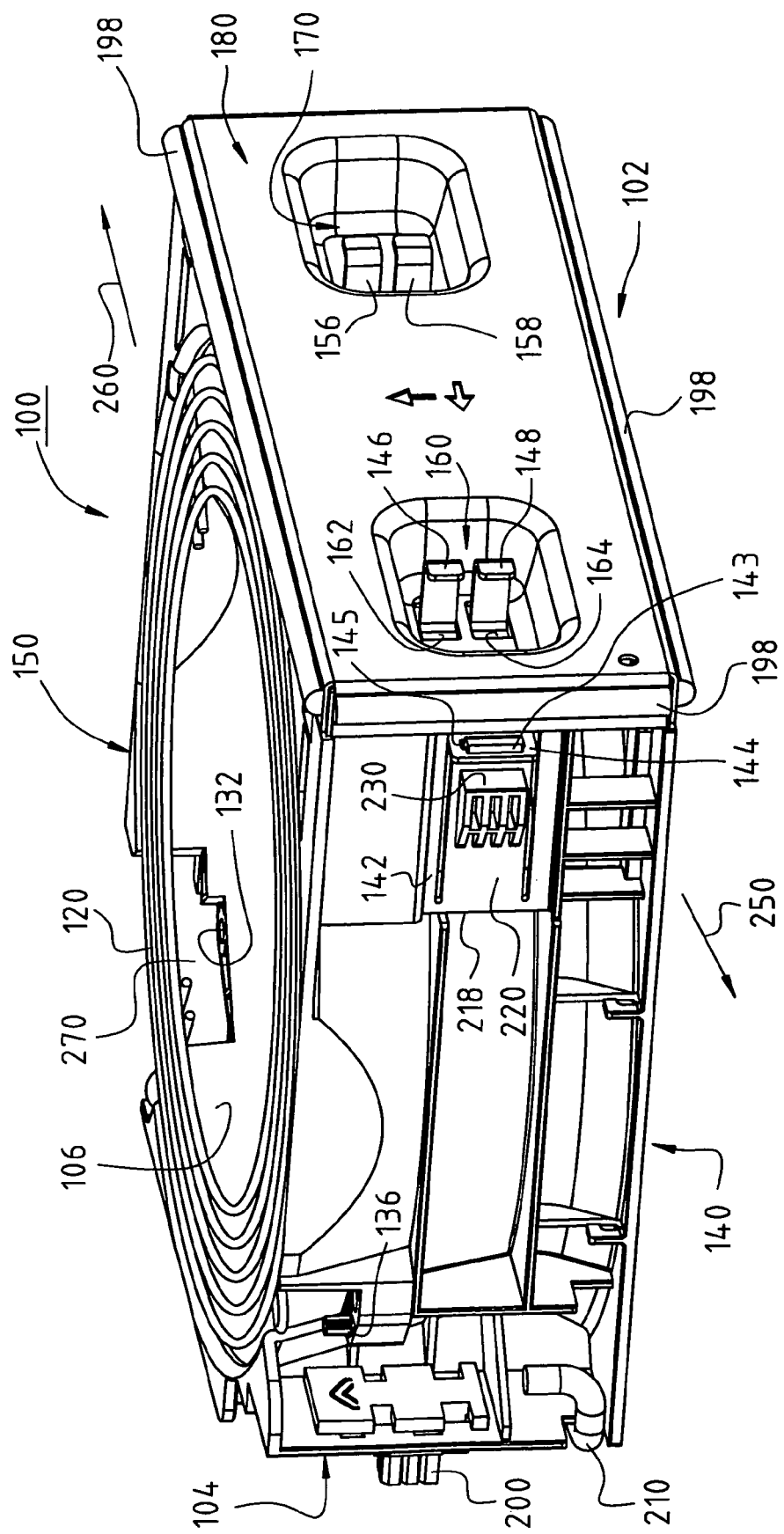
FIG. 2 is a perspective side view of the housing of FIG. 1.
Figure 13:
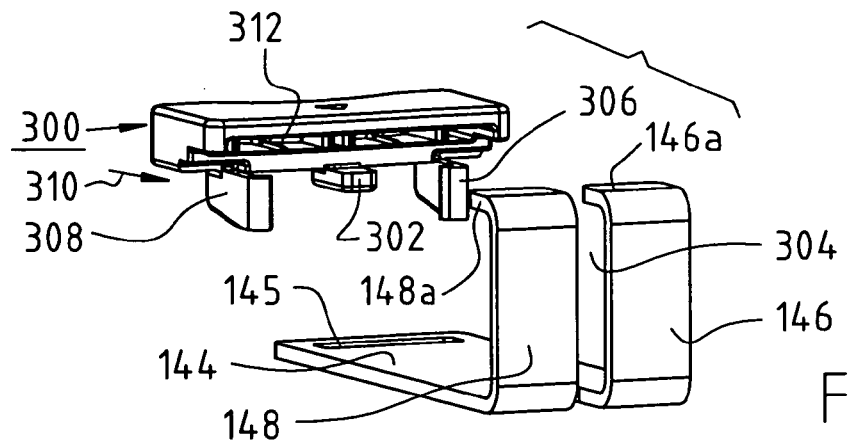
Figure 14:
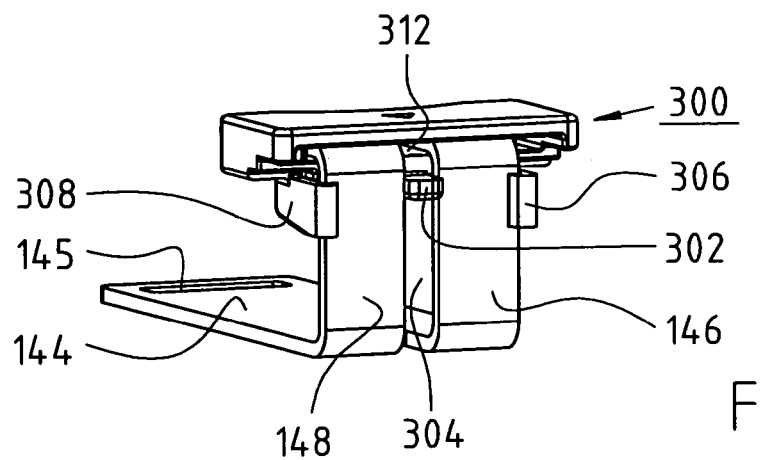
Figure 15:
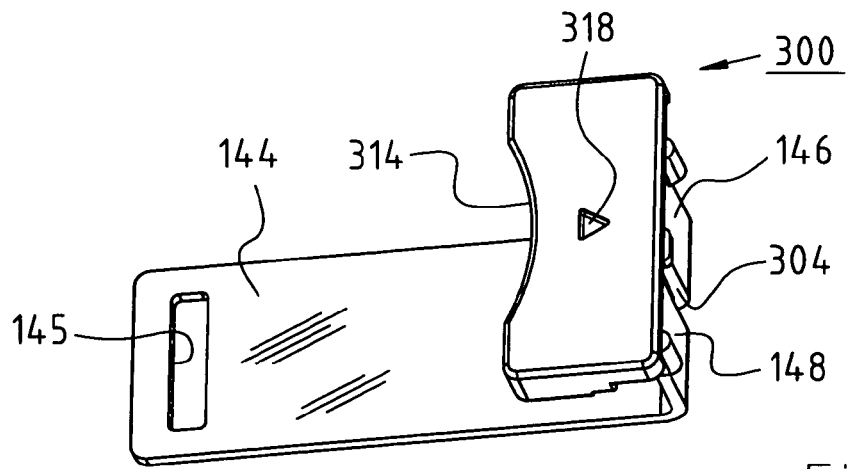
Figure 16:
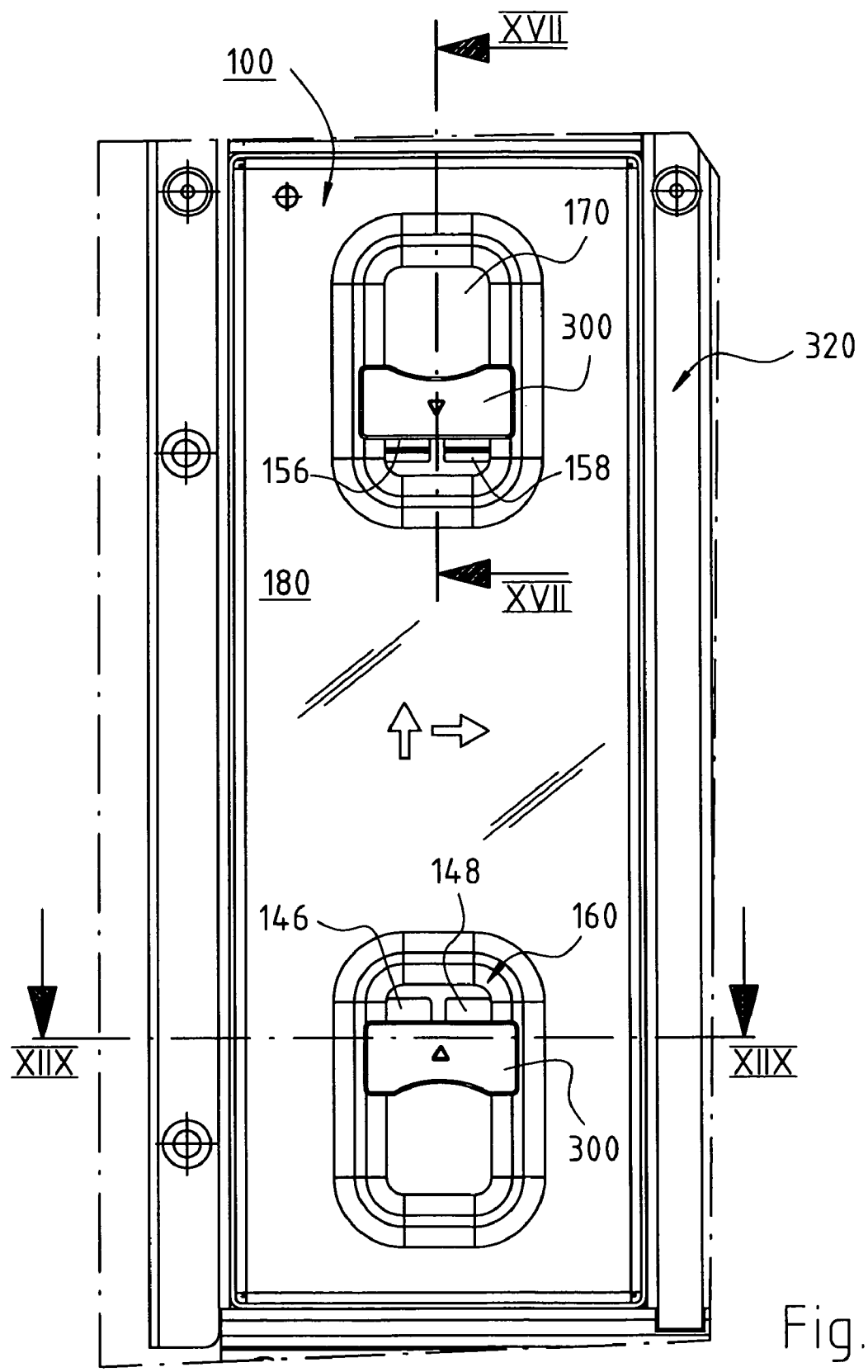
Figure 17:
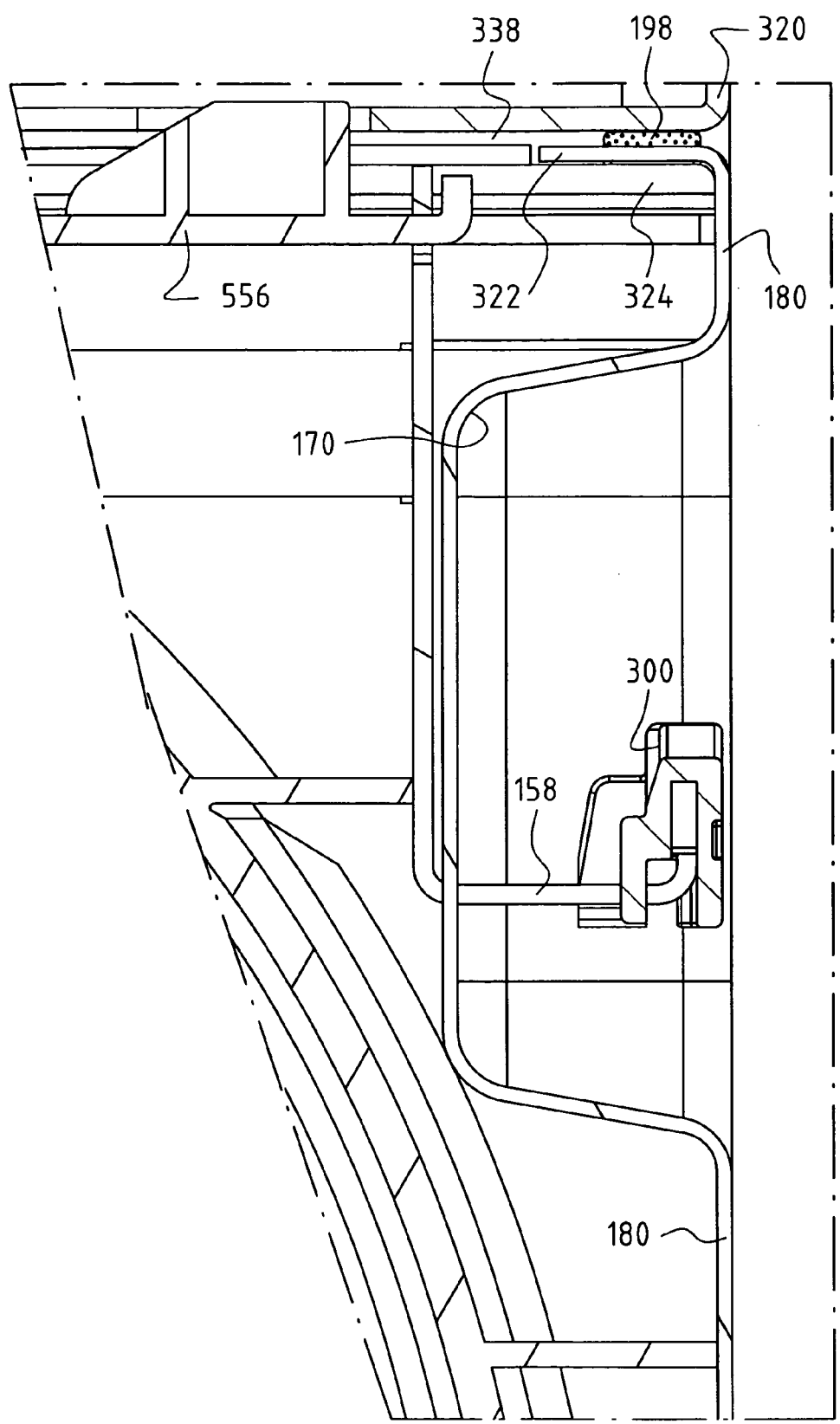

FIG. 13 shows a grip element 300 in the process of its being installed on the parts 146, 148 of FIG. 2, or in other words after the installation of the faceplate 180, in perspective;

FIG. 14 shows a grip element 300 after its installation, in perspective;

FIG. 15 is a view of the installed grip element 300, viewed from a different angle and seen in perspective;

FIG. 16 shows a fan according to the invention in the installed state in a so-called plug-in module;

FIG. 17 is a section taken along the line XVII-XVII in FIG. 16; and

Figure 18:
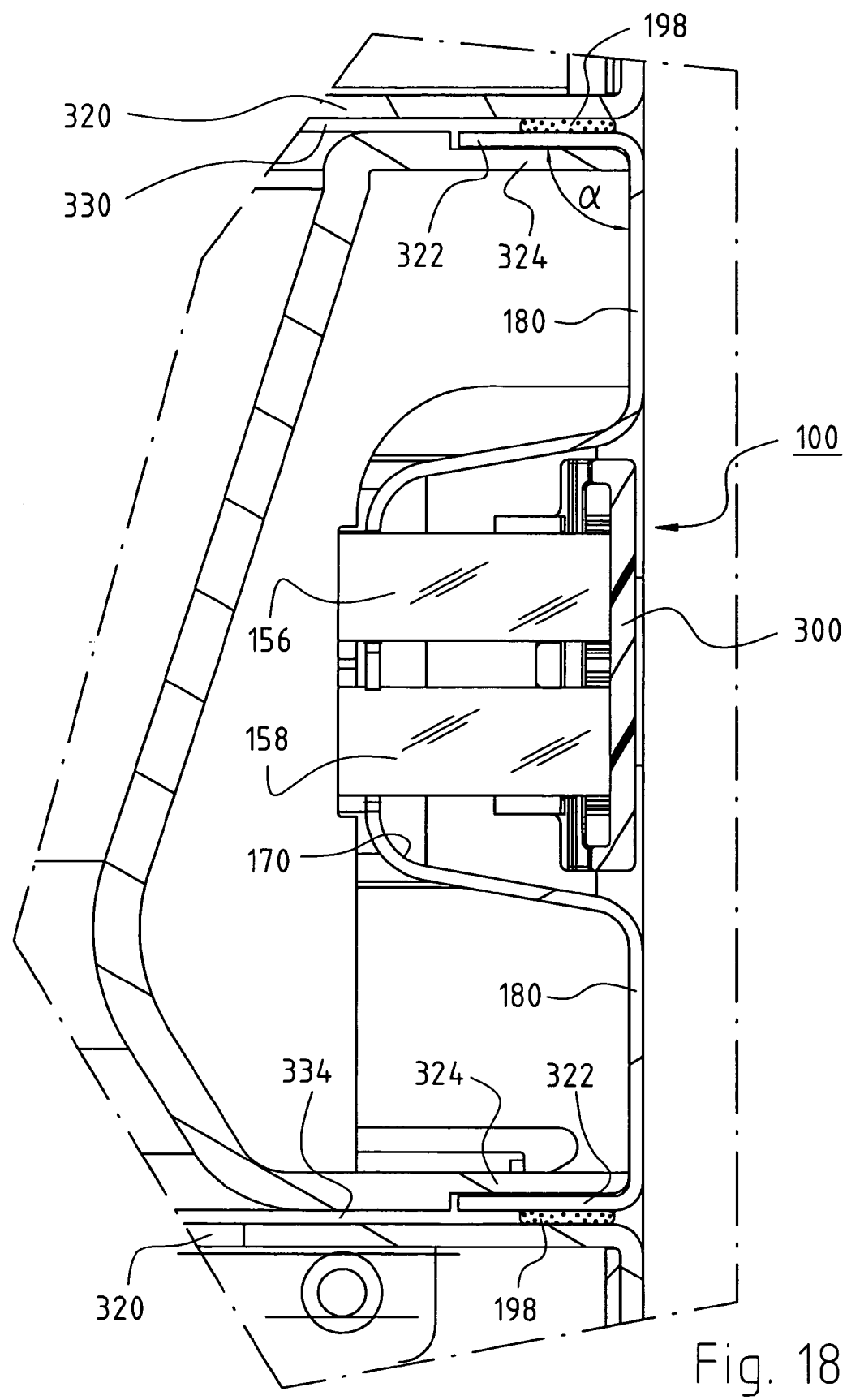

FIG. 18 is a section taken along the line XVIII-XVIII in FIG. 16.

DETAILED DESCRIPTION

In the following description, the terms left, right, top and bottom pertain to the applicable drawing figure, and depending on the orientation chosen (vertical or horizontal) may vary from one drawing figure to the next. Elements that are the same or function the same are designated by the same reference numerals in the various drawings, and will usually be described only once.

Figure 1:
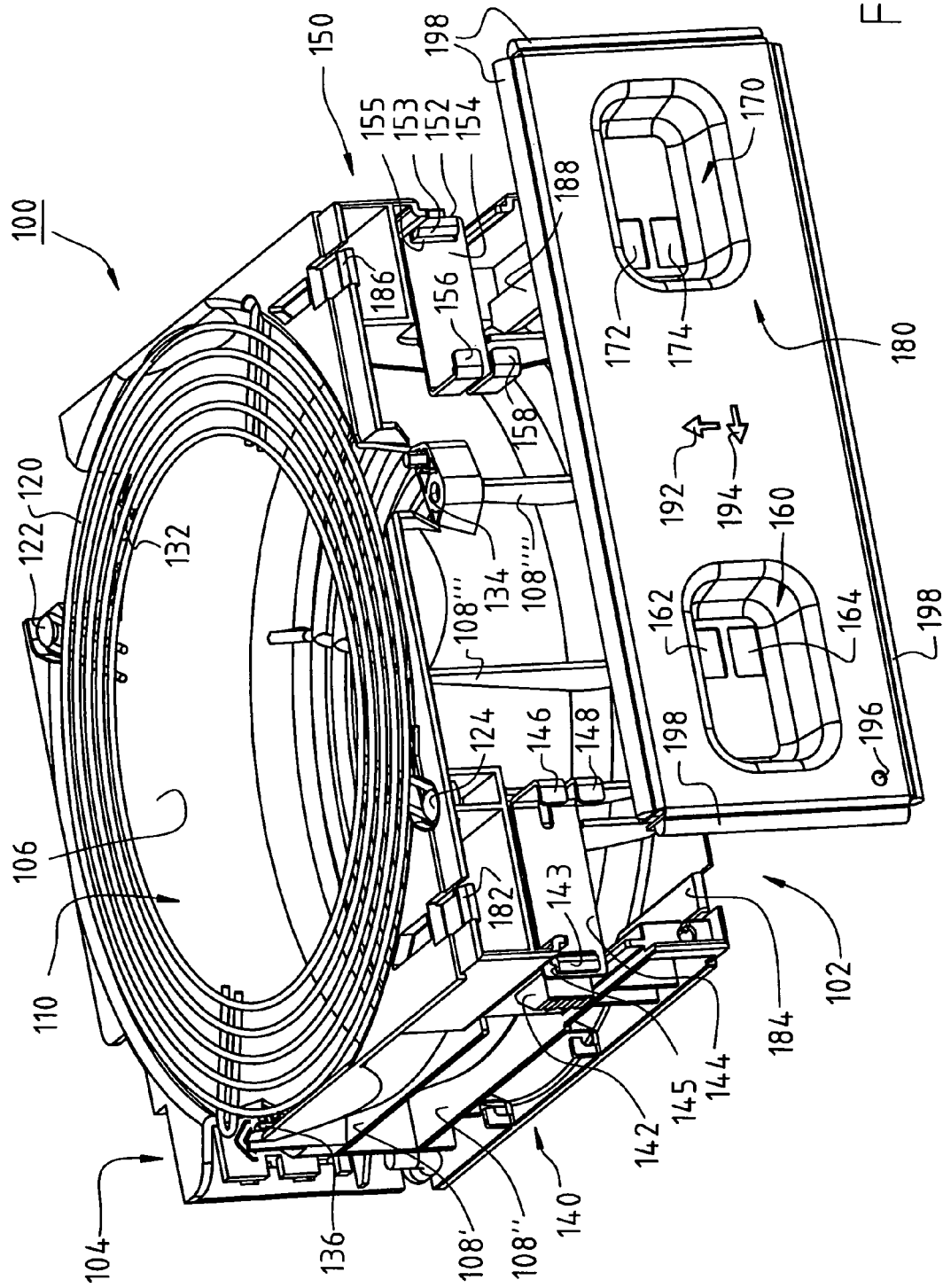
FIG. 1 is a perspective top view on the top side of a housing for an equipment fan according to the invention, showing a faceplate on the front side of the fan before assembly.

FIG. 1 is an enlarged top view on the top side of a fan housing 100 in a preferred embodiment of the invention. This housing has a recess 110 for a fan wheel assembly 20 (FIG. 6), which is bounded by a frustoconical tube 106, for instance. This tube, because of its function, is also known as a Venturi tube 106. On its outsides, the housing 100 has various structural elements, such as reinforcements or braces 108', 108", 108''' and 108'''', of the kind that are used in building housings, and they will therefore not be described here in detail.

The shape of the outline of the housing 100 is approximately rectangular and preferably square, for instance with the standard dimensions of 80×80 mm. The housing 100 is designed for installation in a plug-in fan module 320 (FIGS. 16 through 18), for instance for a control box, not shown. Guide members (not shown), such as guide edges, may be provided on the fan housing 100, which can be guided in corresponding guide rails in the associated equipment for mounting and/or dismounting of the housing 100. The housing 100 has a front side 102, which is shown at the front in FIG. 1, and a back side 104, diametrically opposite it, which is indicated at the back in FIG. 1 and is thus not visible. When the housing 100 is built into the equipment 320, the back side 104 is introduced first into the equipment 320 and then, by pressure against the front side 102, the housing is pushed until it snaps into place in the rack or other equipment.

Figure 6:
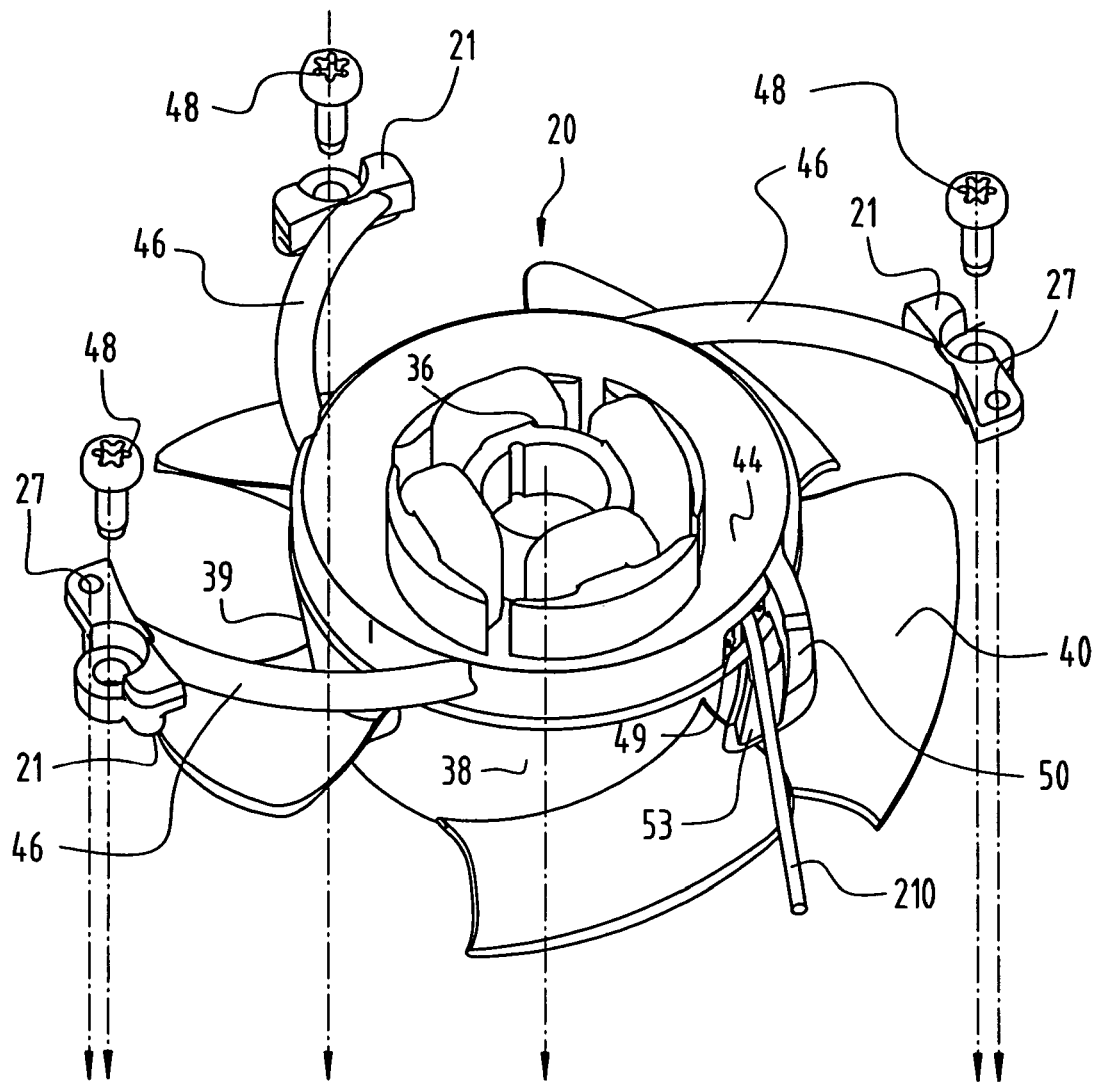
FIG. 6 is an exploded view of a fan wheel arrangement for an equipment fan, in a preferred embodiment of the invention.

As can be seen from FIG. 1, the housing 100 has a guard grille 120, on its top side, that is secured detachably to the housing 100 via suitable fasteners or securing devices 122, 124, such as screws or pins. The guard grille 120 is preferably secured to the housing 100 in such a way that its top side is approximately aligned with the top side of the housing 100. The grille serves to protect users against injury from the blades 40 of the rotating fan (FIG. 6). The fan housing 100 has securing bores 132, 134, 136 for securing the motor and the fan wheel of an associated fan assembly 20; see FIG. 6. For that purpose, ribs which are secured by one end to the associated motor, are screwed on their other, free ends into the securing bores 132, 134, 136 for the sake of fixation in the housing 100. Alternative securing options, such as pins or clamps, are equally well suited.

In a preferred embodiment of the invention, on a lateral boundary face 140 (FIG. 1, left), the fan housing 100 has a resiliently deflectable detent member 142, which is connected to an activatable actuation member 144. To that end, a suspension member 143, for instance, of the detent member 142 is suspended in a recess 145 in the activatable member 144, and as a result a releasable connection between the detent member 142 and the activatable member 144 is achieved. The activatable member 144, on its right end, has two angle elements 146, 148 for its activation. At a lateral boundary face 150 which is shown on the right in FIG. 1 and is substantially diametrically opposite the lateral boundary face 140, the housing 100 has a resiliently deflectable detent member 152, which is connected to an activatable member 154 which has two angle elements 156, 158 for its activation on its left-hand end. The activatable member 154 is releasably connected to the detent member 152, for instance via a suspension member 143 that is suspended in a recess 155 of the activatable member 154. The mode of operation of the resiliently deflectable detent members 142, 152 and of the activatable members 144, 154 will be described in detail below in conjunction with FIG. 5.

As can be seen from FIG. 1, the activatable members 144, 154 are located on the front side of the housing 100, which is covered by a faceplate 180. To that end, in a preferred embodiment of the invention, the faceplate 180 has two troughs or depressions 160 and 170. The depression 160 is shown on the left-hand side of the faceplate 180 in FIG. 1 and has two apertures 162, 164, through which the angle elements 146, 148 of the activatable member 144 protrude when the faceplate 180 is secured to the fan housing 100; see FIG. 2. The depression 170 is shown on the right-hand side of the faceplate 180 in FIG. 1 and has two apertures 172, 174, through which the angle elements 156, 158 of the activatable member 154 protrude, when the faceplate 180 is secured to the fan housing 100; see FIG. 2.

The faceplate 180 is configured to reduce the emission of electromagnetic radiation from the housing 100. To that end, it is formed of metal, or is metallized. It is electrically conductively connected to the housing 100 by using adjustable-height, electrically conductive, resilient guard elements. Thus, the housing 100 also has the function of a radiation protection cage or shielding, for the sake of protecting surrounding electronic components. The apertures 162, 164, 172, 174 in the faceplate 180 can be designed to be so small, for instance smaller than 12 mm, that they are not transmissive for the wavelength of a possible electrical noise emission or radiation.

For being secured to the housing 100, the faceplate 180 is for instance, as shown in FIG. 1, snapped into resilient detent hooks 182, 184, 186, 188. A releasable connection between the faceplate 180 and the housing 100 can thus be achieved.

In the exemplary embodiment shown in FIG. 1, two arrows 192, 194 are applied on the front side of the faceplate 180. The arrow 192 indicates the flow direction of the equipment fan or, in other words, the direction in which air is blown out of the housing 100. The arrow 194 indicates the direction of rotation of the fan wheel of the equipment fan. An LED (Light Emitting Diode), which shows the operating state, may be located in a recess 196 in the faceplate 180. Reference number 198 indicates EMC (Electro-Magnetic Compatibility) sealing elements or gaskets, whose function will be described below, with reference to FIGS. 17 and 18.

FIG. 2 is a perspective side view of the fan housing 100 of FIG. 1 which, in particular, clearly shows the design of the lateral boundary face 140. In FIG. 2, the faceplate 180 is secured to the front side 102 of the fan housing 100, for instance by snapping the faceplate 180 into the resilient detent hooks 182, 184, 186, 188 in FIG. 1. As FIG. 2 shows, the angle elements 146, 148 of the activatable member 144 protrude through apertures 162, 164 in the trough or depression 160 here. The angle elements 156, 158 of the activatable member 154 (which is not visible) protrude into the depression 170. The dimensions of the depressions 160, 170 are such that they can be engaged for actuating the parts 144 and 154, for instance with the thumb of one hand in the depression 160 and the index finger of the same hand in the depression 170.

FIG. 2 also shows the releasable connection of the activatable member 144 to the detent member 142. For this purpose, the suspension member 143 of the detent member 142 is suspended in the recess 145 of the activatable member 144, so that the latter is held on the front side 102 of the housing 100 solely by its suspension from the detent member 142 and in the apertures 162, 164 of the depression 160. Analogously, the activatable member 154 can be held on the front side 102 of the housing 100 solely by its suspension from the detent member 152 and in apertures 172, 174 of the depression 170; see FIG. 1.

In FIG. 2, the detent member 142 has a resilient detent tongue 220, which is secured to a frame structure 218 of the housing and on which a retaining member 230 is formed. The resilient detent tongue 220 and the retaining member 230 are preferably formed in one piece. On its free end, the resilient detent tongue 220 has the suspension member 143, which is suspended in the recess 145 of the activatable member 144. The resilient detent tongue 220 has pretensioning, which serves to move the detent tongue 220, and thus the retaining member 230, away from the housing 100. As indicated by an arrow 250, the retaining member 230 is pressed to the left in the process, away from the lateral boundary face 140 of the housing 100. The structure and function of the detent member 152 correspond to the structure and function of the detent member 142, and a corresponding resilient detent tongue and thus a corresponding retaining member of the detent member 152 (see FIG. 5) are moved, as a result of the corresponding pretensioning, away from the lateral boundary face 150 of the housing 100. As indicated by an arrow 260, the retaining member of the detent member 152 is pressed to the right in the process, away from the lateral boundary face 150 of the housing 100. Thus, the retaining member 230 of the detent member 142 and the corresponding retaining member of the detent member 152 are urged in essentially opposite directions away from the housing 100 by the corresponding pretensionings and, as a result, when the housing 100 is plugged into a piece of equipment, locking of the housing 100 is accomplished, as will be described below in conjunction with FIG. 5.

FIG. 2 shows that the guard grille must first be removed for installing the motor and the fan wheel, so that appropriate struts (see FIG. 6) secured to the fan can be introduced into recesses provided for the purpose in the Venturi tube 106 and can be screwed into the securing bores 132, 134 (not visible), 136, in order to secure the fan unit 20. FIG. 2 shows a recess 270 in the Venturi tube 106, in which a strut is meant to be disposed at the securing bore 132.

FIG. 2 also shows a plug connection 200, which serves to connect the fan unit 20 disposed in the housing 100. The plug 200 is located on the back side 104 of the housing 100 and is electrically connected to the motor via a cord 210 (see FIG. 3). Since when the housing 100 is slid into a piece of equipment 320, the back side 104 is introduced first, an electrical connection with the equipment 320 is automatically accomplished as the housing 100 is introduced.

Figure 3:
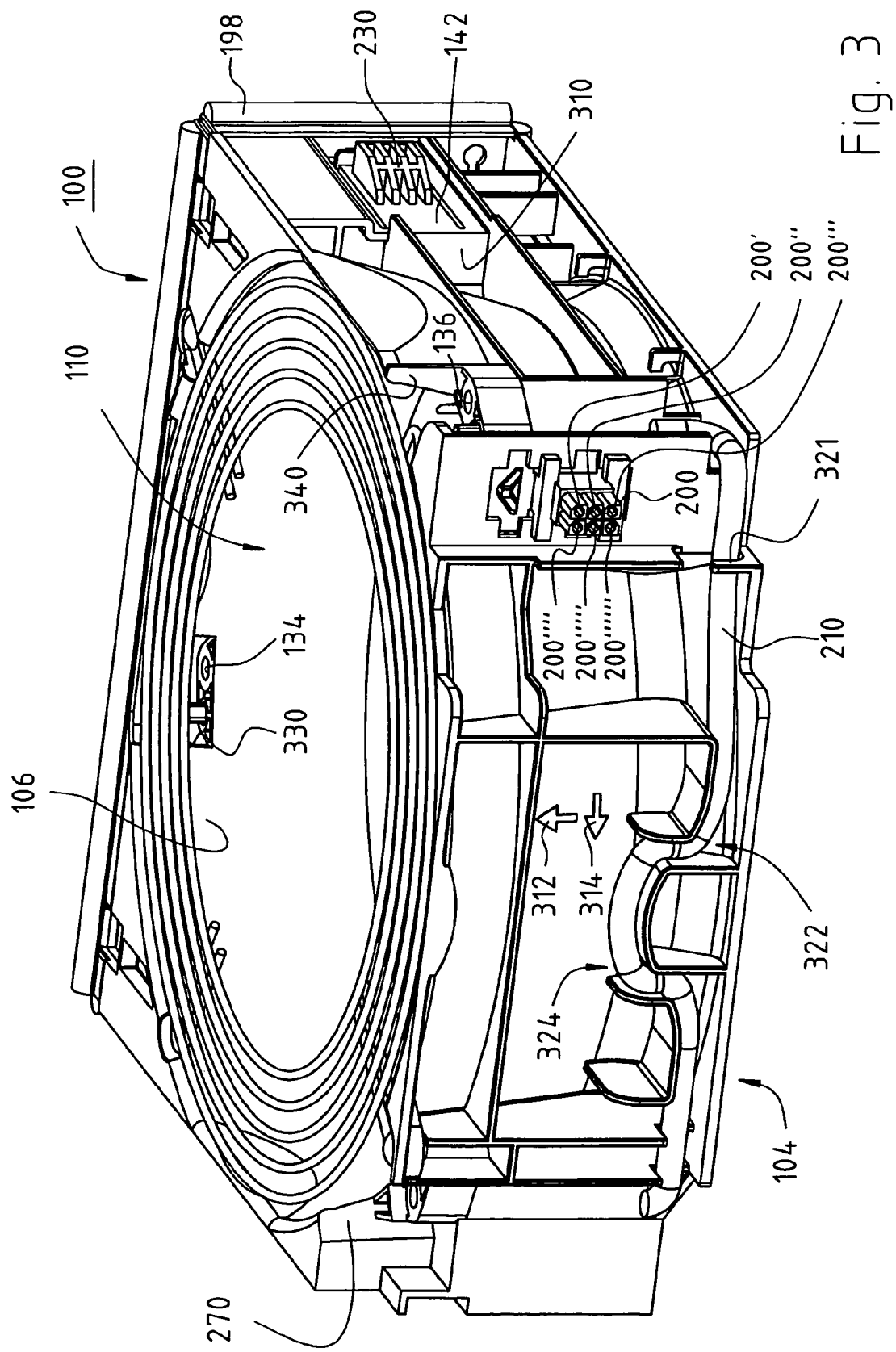
FIG. 3 is a perspective rear view of the housing of FIG. 1.

FIG. 3 shows a perspective back view of the fan housing 100 that clearly shows the design of the back side 104.

FIG. 3 shows the plug connection 200 as a six-prong plug with six terminal poles 200', 200'', 200''', 200'''', 200''''' and 200''''''. An equipment fan requires two cords for supplying an operating voltage. Often, however, still other cords are provided, for instance for a control signal or an alarm signal.

In the fan housing 100, cords from the various individual terminals of the plug 200 extend to the motor of the fan and are bundled in a cord 210, which leads from the plug connection 200 to a motor via a guide channel 321 and cord holder clamps 322 and 324. The cord 210 is only partly shown in FIG. 3.

In FIG. 3, in the Venturi tube 106 in its receptacle 110, a recess 330 is provided for passing through a strut for securing to the securing bore 134. A recess 340 serves there to pass a strut through. FIG. 3 also shows that the detent member 142 is secured to a rigid frame element 310 of the housing 100.

Arrows 312, 314 are shown on the back side 104, which correspond in their function to the arrows 192 and 194.

Figure 4:
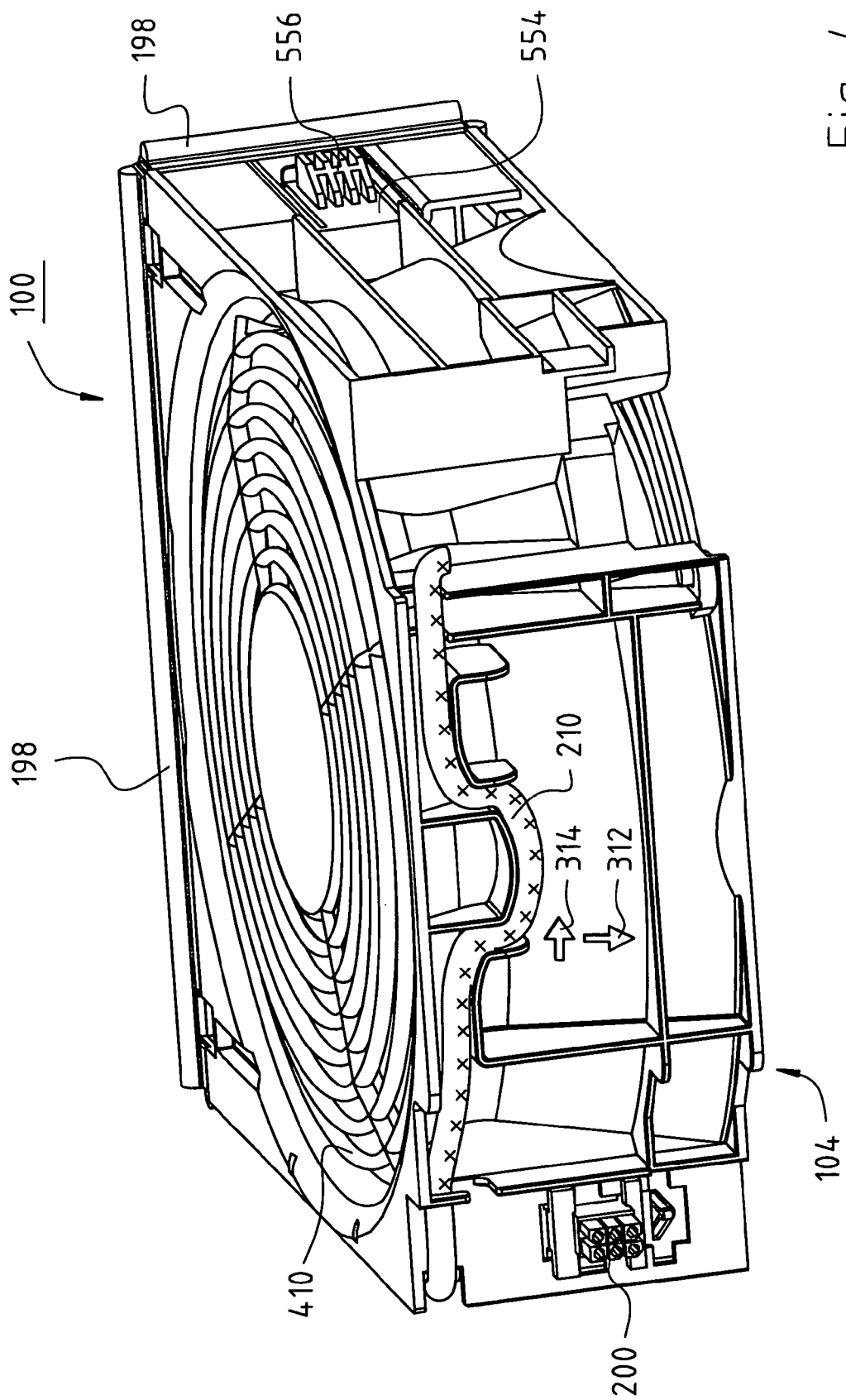
FIG. 4 is a perspective plan view on the underside of the fan housing of FIG. 1.

FIG. 4 is an enlarged plan view on the underside of the housing 100. The plan view of FIG. 4 is substantially equivalent to the perspective back view of FIG. 3, but the housing 100 of FIG. 3 is shown rotated approximately 180° in FIG. 4.

FIG. 4 shows that the fan housing 100, on its underside, has a guard grille 410, which here is secured undetachably to the housing 100. The underside of the housing 100 and the guard grille 410 may be in one piece. The guard grille 410 is formed on the underside of the housing 100 in such a way that its underside is aligned with the underside of the housing 100.

Figure 5:
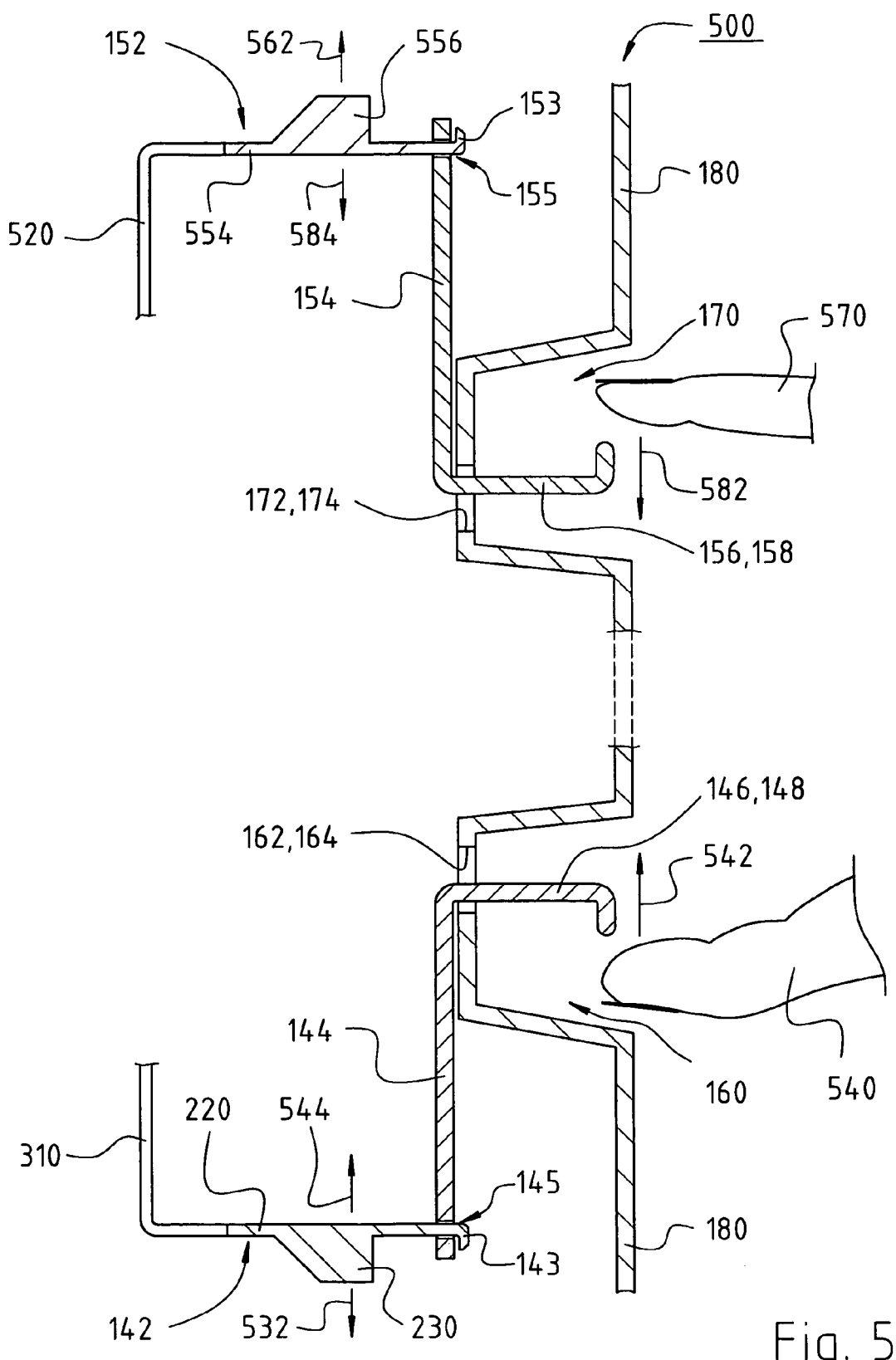
FIG. 5 is a schematic illustration of two detent members and their actuation devices, for a housing in a preferred embodiment of the invention.

FIG. 5 shows a detent device 500 for the housing 100. It is formed by detent members 142, 152 with their associated activatable members 144, 154 in collaboration with the faceplate 180.

The suspension member 143 of the detent member 142 is suspended in the recess 145 of the member 144, and the angle elements 146, 148 of the member 144 protrude through the recesses 162, 164 in the depression 160. The suspension member 153 of the detent member 152 is suspended in the recess 155 of the member 154, and the angle elements 156, 158 of the activatable member 154 protrude through the recesses 172, 174 in the depression 170 of the faceplate 180. The detent member 142 has a resilient detent tongue 220 and a retaining member 230 and is secured to the frame element 310 of the housing 100.

By means of the initial tension of the detent tongue 220, the retaining member 230 is urged in the direction of an arrow 532, as shown in FIG. 5. The detent member 152 has a resilient detent tongue 554 and a retaining member 556 and is secured to a frame element 520 of the housing 100, which corresponds in structure and function to the frame element 310. By means of the initial tension of the detent tongue 554, which corresponds to the initial tension of the detent tongue 220, the retaining member 556 is urged in the direction of an arrow 562, as shown in FIG. 5. Thus the retaining members 230, 556, because of the corresponding initial tensions of their detent tongues 220, 554, are urged in opposite directions. When the housing 100 is slid into a piece of equipment 320 (FIG. 16), the deflection of the retaining members 230, 556 there brings about an automatic locking of the housing 100.

In a preferred embodiment of the invention, the depression 160 can be engaged, for instance with the thumb 540 of one hand, for actuating the angle elements 146, 148. At the same time, with the index finger 570 of the same hand, the depression 170 can be engaged to actuate the angle elements 156, 158. As FIG. 5 shows, the dimensions of the depressions 160, 170 are such that they can be engaged with the thumb 540 and the index finger 570 for actuating the activatable members 144 and 154.

Thus by a simultaneous actuation of the angle elements 146, 148, 156, 158, an undoing of the locking of the housing 100 in the associated equipment can be attained, and the housing 100 can be pulled out. Thus using the thumb 540 and index finger 570 of one hand, one-handed removal of the housing 100 from the equipment 320 can be accomplished.

FIG. 6 shows as an example an exploded view of a structural unit 20 comprising a drive motor 36 and a fan wheel 38 with fan blades 40, in this case the fan wheel 38 for a diagonal fan. This kind of fan has advantages for some applications, because it produces a more-favorable characteristic fan curve. For instance if a filter is clogged and the flow rate dV/dt of the equipment fan 20 drops, the generated pressure Delta pf (static pressure) increases more markedly in a diagonal fan than in an axial fan, which represents a margin of safety for the user, especially whenever a high pressure and a large quantity of air are demanded. The stator of the motor 36 is represented by dashed lines. Preferably, an electronically commutated external rotor motor 36 will be used.

The shape of the fan blades 40 is adapted to the conical shape of the inside of the Venturi tube 106. The fan wheel 38 is formed frusto-conically on its outside 39 and, together with the frusto-conical Venturi tube 106, it forms an air passage opening, which in FIGS. 1 through 3 is covered in the housing 100 by the metal guard grille 120, which forms an additional shield.

For installing the motor 36, a securing flange 44 is used, which is joined to the housing 100 via thin retaining struts 46. Screws 48 are used for this, which are screwed into the securing bores 132, 134 and 136 in the housing 100 of FIGS. 1 through 4. To that end, on their free ends, the struts 46 have widened areas 21, which fit into the corresponding recesses 270, 330 and 340 of the housing 100 (see FIG. 3). In particular, two of the recesses 270, 330 and 340 have a centering pin with clamping ribs, which fits into a corresponding receptacle 27 in the associated widened area 21 and thus centers the hub 44 exactly in the conical Venturi tube 106 of the housing 100 of FIGS. 1 through 4.

It will be noted that the widened areas 21 of the structural unit 20 are located at two 90° angles and one 180° angle from one another, while the recesses 270, 330 and 340 of the housing 100 are shown at 120° angles from one another as an example. This is meant to illustrate the fact that various designs of fasteners or securing devices are possible; for one skilled in the art, it is quite clear that the disposition of the widened areas 21 and of the recesses 270, 330 and 340 should be adapted to each other.

A shortened strut 50 is also provided on the hub 44; its function is to brace the flexible connection cord 210 of the motor 36. As FIG. 6 shows, the cord 52 comes through a lateral opening 49 in the hub 44 from the motor 36, where it is soldered, for instance, to a printed circuit board (not shown) and is then placed in a guide 53 provided on the strut 50 and is then extended onward to the outside to the fan housing 100, where a strain relief for the cord 210 may be provided.

The motor 36 is solidly connected to the hub 44 via retaining claws, not shown, and the struts 46, 50 are preferably formed in one piece with the hub 44.

As already described, for installing the structural unit 20 in the housing 100 of FIGS. 1 through 4, the guard grille 120 is removed, and the structural unit 20 is lowered into the fan housing 100, as indicated by arrows in FIG. 6. After that, the guard grille 120 is slid into the top of the fan housing 100 again and secured.

Figure 7:
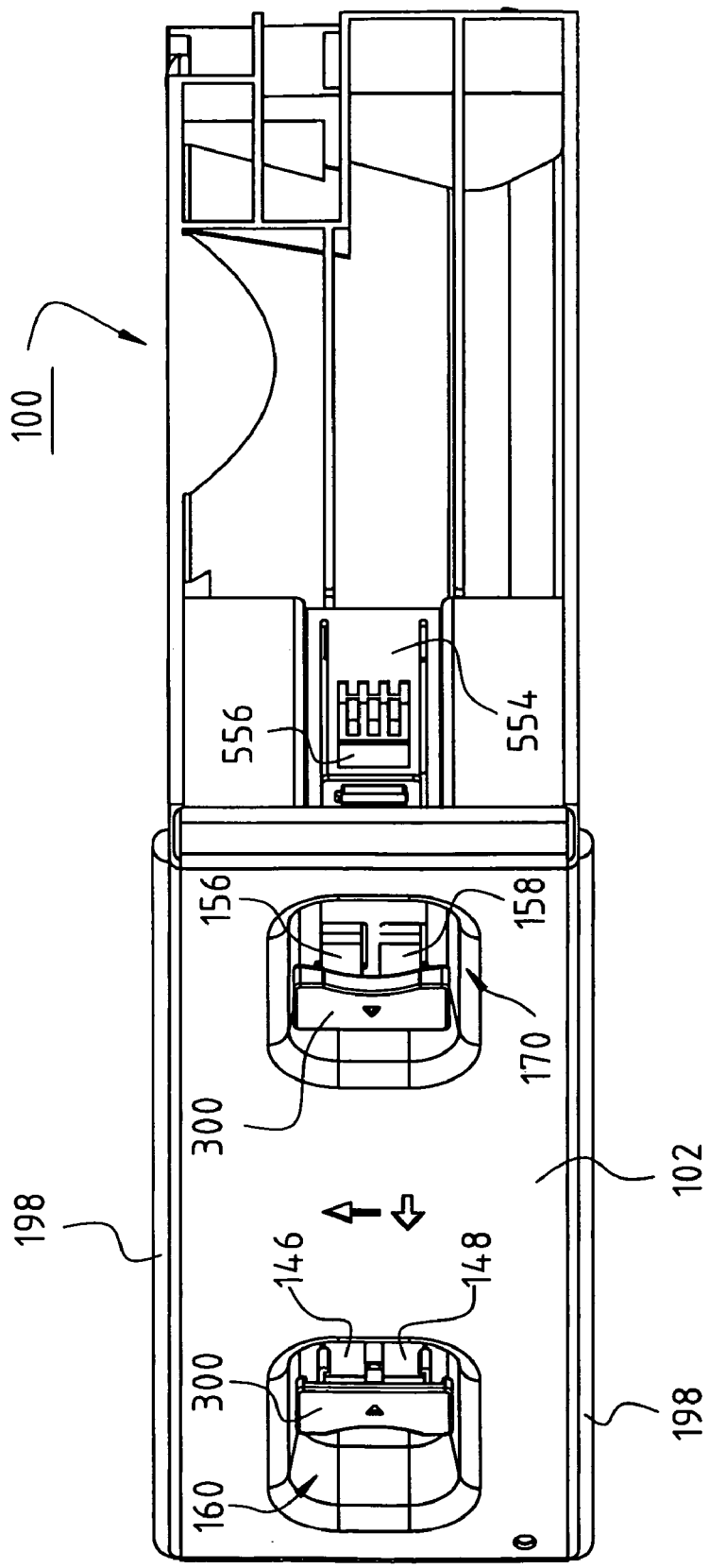
FIG. 7 is a perspective view, approximately analogous to FIG. 2 but seen from a different angle, in which the actuation members in the troughs 160, 170 in the grip are provided with grip elements 300, to make actuation more convenient and logical.

FIG. 7 shows a plug-in fan 100, in which one grip element 300 is mounted in the parts 146, 148 and another in the parts 156, 158.

The reason for this is that when a fan 100 is pulled out of a control box or a plug-in module, the plug 200 must also pulled out of its counterpart element, which requires considerable force that can amount to 30 N, for instance. The grip elements 300 thus also serve, after the unlatching, to transmit a pulling force to the plug-in fan 100, in order to pull this fan out of the control box, and they are configured accordingly.

Figure 8:
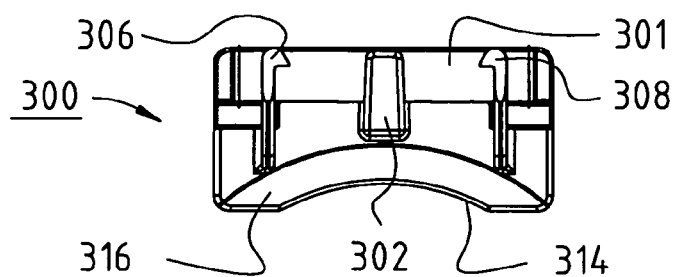
FIG. 8 shows a grip element 300, viewed in the direction of the arrow VIII in FIG. 11.
Figure 9:
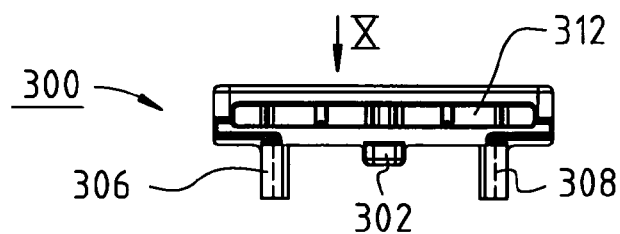
FIG. 9 is a side view of the grip element of FIG. 8, viewed in the direction of the arrow IX in FIG. 10.
Figure 10:
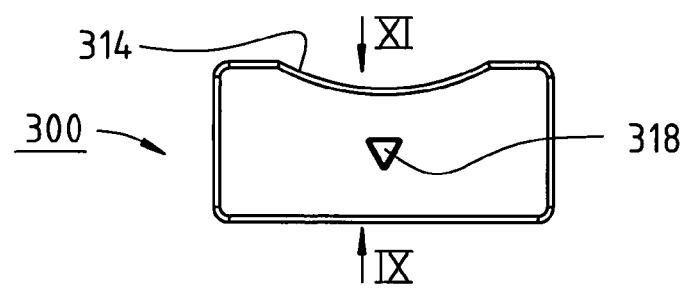
FIG. 10 shows a grip element 300 of FIGS. 8 and 9, viewed in the direction of the arrow X in FIG. 9.

FIG. 8 is a plan view of the underside 301 of a grip element 300. In the middle, there is a spacer 302, which in FIGS. 13 and 14, upon assembly, is thrust into the interstice 304 between the parts 146, 148, in order to prevent this interstice from being made any smaller.

Figure 12:
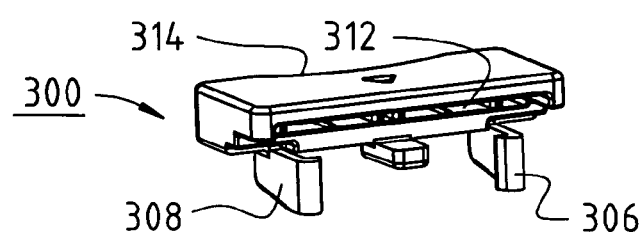
FIG. 12 is a perspective view of a grip element 300 before its installation.

Also located on the underside 301 are two resilient detent hooks 306, 308, whose shape is best seen in FIG. 12. On their free end, they each have one inward-protruding hook, whose location, after assembly, can be seen in FIG. 14.

FIG. 13 shows the assembly of these detent hooks 306, 308. It is accomplished by slipping a grip element 300, in the direction of an arrow 310, onto the bent upper ends 146a, 148a of the parts 146, 148, whereupon these upper ends engage in a recess 312 in the grip element 300, and the detent hooks 306, 308 snap onto the outsides of the parts 146, 148 in the way shown in FIG. 14. In this way, the required pulling force can be transmitted from a grip element 300 to the upper ends 146a, 148a and, from them, to the parts 146, 148 and from them, in turn, to the plug-in fan 100.

Figure 11:
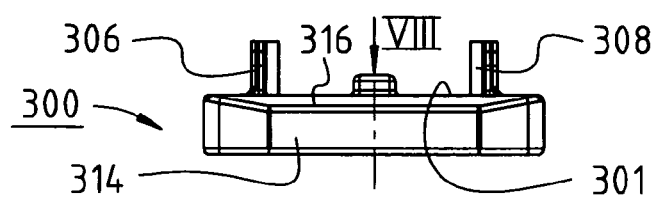
FIG. 11 shows a grip element 300 of FIGS. 8 through 10, viewed in the direction of the arrow XI in FIG. 10.

The securing of a grip element 300 to the parts 156, 158 proceeds identically and will therefore not be described separately. This is due to the symmetrical construction of the front side of the plug-in module 100.

Where the grip element 300 is grasped by the user, it is formed essentially in the shape of a trough 314 and has, on its underside 301 in the area of this trough 314, a slight chamfer 316, whose shape can be seen from FIGS. 8 and 11. Such a shape is especially favorable for grasping. The grip element 300 also has a triangular symbol 318 on its top side, which indicates the direction in which the grip element 300 must be displaced upon unlatching.

FIG. 16 shows a fan (of the kind shown in FIG. 7) with a fan housing 100, in the installed configuration as a plug-in module 320. The position for use here is vertical. Elements that are the same or function the same as in FIGS. 7 through 15 are identified by the same reference numerals and will usually not be described again.

The term "plug-in fan module 320" is understood to mean a part that looks like a vertical drawer, which can be pulled out of the applicable control box, and in which a plurality of fans, usually four fans, is located.

In practice, such fans are monitored continuously, and if a fault condition is detected, the applicable plug-in module 320 is pulled out, and the defective fan is pulled out of the plug-in module 320 and replaced by a new one, and then the plug-in module 320 is pushed back into the control box or rack, without requiring an interruption in operation for the purpose.

This is known as a "hot swap" or "change on the fly." This is made substantially easier by the grip elements 300. In this way, an interruption in operation is avoided, since the swapping out is done very quickly.

The plug-in module 320, as shown in FIG. 16, surrounds the faceplate 180 with slight spacing.

The faceplate 180 itself is formed as a deep-drawn part, typically of metal, or of metallized plastic, and its edges 322 extend perpendicular to the plane of the front side that is visible in FIG. 16, or in other words at an angle $\alpha$ (FIG. 18) with respect to this front side; $\alpha$ is typically in the range of 90°.

These edges or lips 322 are thrust or pressed onto corresponding peripheral portions 324 of the housing 100 and thus prevent the emission of electromagnetic radiation from the housing 100. The fastening is comparable to the fastening of the lid of a metal can, such as the lid of a can of shoe polish, which likewise forms a very tight closure.

In FIG. 18, between the faceplate 180 of the plug-in fan and the plug-in fan module 320, there is a gap 330, which is additionally sealed off by the EMC (Electro-Magnetic Compatibility) sealing element 198. This last element preferably comprises a metal cloth braid, which is disposed on a polyurethane core. Naturally, many types of such sealing tapes may be used. This sealing element 198 is deformed by the pushing in of the fan and thus creates a large-area connection.

Toward the bottom in FIG. 18, there is an analogous gap 334, which is closed off from the outside at the edge by the sealing element 198.

FIG. 17 analogously shows a gap 338, which is closed off from the outside by the EMC sealing element 198.

An EMC sealing tape 198 of this kind accordingly extends all the way around the entire periphery of the faceplate 180 and prevents the escape of electromagnetic radiation there. It also connects the faceplate 180 over a large area with the plug-in fan module 320 and thus assures that the faceplate 180 becomes fully effective as part of the electromagnetic shielding.

In this way, by the cooperation of the plug-in fan module 320, which itself forms a metal shield, the control box (not shown), the faceplate 180 with its deep-drawn edges 322, and the EMC sealing tape 198, very good shielding is achieved, which extensively prevents the emission of electromagnetic radiation from the plug-in fan module 320 and nevertheless makes a very fast change of a defective fan on the fly possible.

It is understood that many changes and modifications are possible within the scope of the present invention. Therefore, the invention is not limited to the specific embodiments shown and described, but rather is defined by the following claims.

What is claimed is:

1. An equipment fan, having a housing (100) which is adapted for use as a plug-in module for a piece of equipment (320), the housing defining a generally annular recess (110), in which a fan wheel and an electric motor serving to drive it (20) are located, wherein, during operation, air is transported by said fan wheel from an air inlet side of the housing (100) to an air outlet side, wherein
   a front side (102) and a back side (104) of the housing extend between the air inlet side and the air outlet side, and upon installation, the back side (104) is slid into the equipment (320) first,
   a first lateral boundary face (140) and a second lateral boundary face (150) of the housing (100) extend between the air inlet side and the air outlet side and between the front side (102) and the back side (104),
   further comprising
   a faceplate (180), formed of material which limits emission, from the housing, of electromagnetic radiation, provided on the front side (102) of the housing (100), said faceplate being formed with indentations (160, 170);
   a first resiliently deflectable detent member (142) arranged at the first lateral boundary face (140);
   a first actuation member (144) which extends from the front side (102) of the housing (100) and is operable to actuate said first deflectable detent member (142), said first actuation member (144) extending into one (160) of said indentations in said faceplate;
   a second resiliently deflectable detent member (152) arranged at the second lateral boundary face (150); and
   a second actuation member (154) which extends from the front side (102) of the housing (100) and is operable to actuate said second deflectable detent member (152), said second actuation member extending into another one (170) of said indentations in said faceplate (180); said first and second actuation members (144, 154) being arranged on the front side (102), with a spacing selected such that said actuation members (144, 154; 300) can be simultaneously actuated using only one hand.

2. The equipment fan as defined by claim 1, in which each of the resiliently deflectable detent members (142, 152) is pretensioned to urge the detent member away from the housing (100) so that, when the housing (100) is slid into a piece of equipment (320), latching of the housing (100) into the equipment (320) is accomplished by sidewise movement of said detent members (142, 152).

3. The equipment fan as defined by claim 1,
   in which the housing (100) and the actuation members (144, 154; 300) are configured and dimensioned to enable one-handed mounting and dismounting of the housing (100) in a piece of equipment (320).

4. The equipment fan as defined by claim 1,
   in which the faceplate (180) has an edge (322), which protrudes in a direction away from the faceplate toward the housing (100) and in an installed configuration, forms an essentially radiation-tight connection with the equipment (320).

5. The equipment fan as defined by claim 4,
   in which the faceplate (180) is formed as a deep-drawn part, whose shape in outline in the region of the front side (102) of the housing (100) forms a plane, with which the edge (322) defines an angle ($\alpha$).

6. The equipment fan as defined by claim 5, in which the angle ($\alpha$) is approximately 90°.

7. The equipment fan as defined by claim 1, in which at least one contact element (182, 186) is provided, which, in an installed configuration, connects the faceplate (180) electrically to the housing (100).

8. The equipment fan as defined by claim 1, in which extending around the faceplate (180), at least one electromagnetic compatibility (EMC) sealing element (198) is provided which, whenever the fan after its installation in a piece of equipment (320) forms a gap (330, 334, 338) with the housing, seals off this gap and reduces the emission of electromagnetic radiation from this gap.

9. The equipment fan as defined by claim 8, in which the EMC sealing element (198) has a braid of metal cloth.

10. The equipment fan as defined by claim 1, in which the faceplate (180) comprises metal.

11. The equipment fan as defined by claim 1, in which the faceplate (180) comprises metallized plastic.

12. The equipment fan as defined by claim 1,
    in which the housing (100) has at least one securing device (182, 184, 186, 188) which is adapted for securing the faceplate (180) to the housing (100).

13. The equipment fan as defined by claim 1,
    in which the first detent member (142) has a first pretensioning, which is configured to move this detent member away from the housing (100),
    and the second detent member (152) has a second pretensioning, which is configured to move this detent member away from the housing (100),
    and the first and second pretensionings act essentially in opposite directions (250, 260), in order, when the housing (100) is slid into an equipment rack (320), to accomplish latching by means of the two detent members.

14. The equipment fan as defined by claim 1,
    in which the first and the second actuation members (144, 154) are configured such that, when actuated, they move the first and second detent members (142, 152) out of a latched configuration in the direction of the housing (100), in order to accomplish unlatching.

15. The equipment fan as defined by claim 1, further comprising
    a plug assembly (200) for electrical connection, provided on the back side (104) of the housing (100).

16. The equipment fan as defined by claim 15, wherein
    the plug assembly (200) is adapted to make an electrical connection between the equipment fan and the equipment (320) automatically, as the housing (100) is slid into a piece of equipment (320).

17. The equipment fan as defined by claim 1, which is configured as a mixed-flow fan.

* * * * *